United States Patent
Beitelmal et al.

(10) Patent No.: US 6,525,936 B2
(45) Date of Patent: Feb. 25, 2003

(54) AIR JET COOLING ARRANGEMENT FOR ELECTRONIC SYSTEMS

(75) Inventors: Abdlmonem H Beitelmal, Palo Alto, CA (US); Chandrakant D. Patel, Fremont, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/845,545

(22) Filed: Apr. 30, 2001

(65) Prior Publication Data

US 2002/0159232 A1 Oct. 31, 2002

(51) Int. Cl.[7] ................................................. H05K 7/20
(52) U.S. Cl. ....................... 361/695; 361/687; 361/692; 165/80.2; 165/122; 454/184
(58) Field of Search ................................... 361/683, 687, 361/717–719, 689, 690, 692, 695, 724, 756; 165/80.3, 165, 185, 122, 124, 126; 174/15.1, 16.1; 257/712, 713, 721, 723, 724; 454/184; 62/259.2, 418; 415/66; 416/120–128; 29/893.035, 890.03; 236/49.4

(56) References Cited

U.S. PATENT DOCUMENTS

| | | | | |
|---|---|---|---|---|
| 3,843,910 A | * | 10/1974 | Ringuet | 317/100 |
| 4,214,706 A | * | 7/1980 | Gee et al. | 239/553.3 |
| 4,261,519 A | * | 4/1981 | Ester | 239/548 |
| 4,417,295 A | * | 11/1983 | Stuckert | 361/384 |
| 4,463,897 A | * | 8/1984 | Denneny et al. | 236/92 R |
| 4,674,004 A | * | 6/1987 | Smith et al. | 361/384 |
| 4,851,965 A | * | 7/1989 | Gaburda et al. | 361/383 |
| 5,321,581 A | | 6/1994 | Bartilson et al. | |
| 5,559,673 A | * | 9/1996 | Gagnon et al. | 361/695 |
| 5,566,377 A | * | 10/1996 | Lee | 361/695 |
| 5,640,046 A | | 6/1997 | Suzuki et al. | |
| 5,751,549 A | | 5/1998 | Eberhardt et al. | |
| 6,021,042 A | * | 2/2000 | Anderson et al. | 361/695 |
| 6,134,108 A | | 10/2000 | Patel et al. | |
| 6,141,213 A | | 10/2000 | Antonuccio et al. | |
| 6,280,318 B1 | * | 8/2001 | Criss-Puszkiewicz et al. | 454/184 |

FOREIGN PATENT DOCUMENTS

| | | | | | |
|---|---|---|---|---|---|
| JP | 402065608 A | * | 3/1980 | | H02B/1/56 |
| JP | 360223929 A | * | 11/1985 | | F24F/3/044 |
| JP | 408153985 A | * | 6/1996 | | H05K/7/20 |
| SU | 1626473 A | * | 2/1991 | | F24F/1/02 |

* cited by examiner

Primary Examiner—Darren Schuberg
Assistant Examiner—Michael Datskovsky

(57) ABSTRACT

An air cooled electronic system within an enclosure simultaneously provides different levels of cooling in response to the individual cooling needs of the various electronic components. In one embodiment, electronic system includes a plenum that has an inlet and a plurality of outlets with the inlet receiving air from outside the enclosure. A rate of airflow at the respective plenum outlets varies as a function of a static air pressure behind the plenum outlets and a shape of the respective outlets, the static air pressure being a function of the shape of a cavity within the plenum. The system also includes a plurality of air ducts respectively coupled to the plurality of plenum outlets, with each air duct having a length and an outlet characterized by an outlet size. A first one of the air ducts has an outlet that is disposed proximate a first subset of the electronic components and a second one of the air ducts has an outlet that is disposed proximate a second subset of the electronic components. The electronic system further includes a blower arrangement disposed within the enclosure that draws external air and blows the air into the plenum.

23 Claims, 5 Drawing Sheets

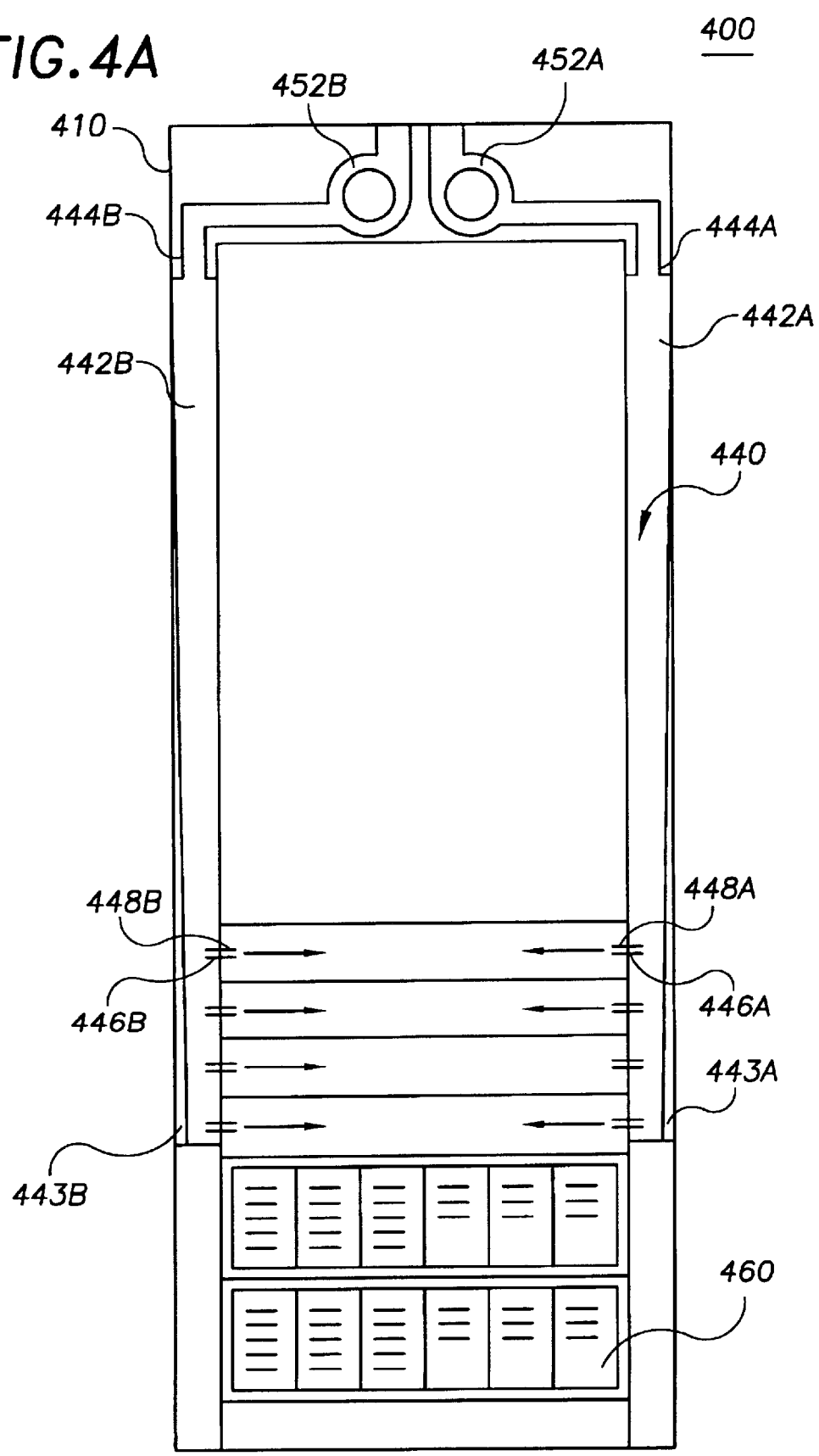

AIR JET COOLING ARRANGEMENT FOR ELECTRONIC SYSTEMS

FIELD OF THE INVENTION

The present invention generally relates to cooling systems for electrical and electronic components and subsystems, and more particularly to air cooling of electrical and electronic components.

BACKGROUND OF THE INVENTION

Enclosures for containing and supporting electrical and electronic components are designed to meet various operating requirements. While maintaining the components inside relatively free from excessive shock, vibration and dust the enclosure needs to provide a system that cools or draws heat generated from the components. One way to cool the components is to provide a cooling airflow through the enclosure in order to remove heat that is generated by operating components.

As the packing density of electronic components increases in response to demands for higher performance systems, more printed circuit boards are being mounted closer together. The proximity of the boards greatly increases the airflow impedance and decreases the allowable maximum component height on each board. This creates difficult cooling problems such as hot spots and dead zones on the boards, and this is additionally complicated by the increased power requirement for today's high-speed integrated circuits. These high-power, high-speed circuits not only require large volumes of airflow for cooling but also require very small enclosure openings to contain electromagnetic radiation.

The tangential, unidirectional nature of the airflow cooling methods causes multiple components to be cooled in series. Consequently, the downstream components are cooled by preheated air and thus are cooled by lesser amounts than are upstream components. Using a high airflow rate and heat sinks with large surface areas reduce the impact of this drawback. Fan modules that provide the high airflow rate are usually mounted on the back of the enclosure. The enclosure is typically designed with an air plenum that draws air through individual internal components via the fans of the airflow cooling system. An example of air volume flow rates for microprocessors in an electronic system is in the range of about 2.5 to 5 liters/second with a velocity of about 2 to 3 meters/second. Large multiple processor systems and large multiple disk drive systems used in dedicated computer rooms can be cooled by moving air at high mass flow rates with the resulting acoustic noise generally having to be tolerated. On the other hand, multiple processor and multiple disk systems used in office environments must meet more stringent acoustic emission guidelines and regulations as well as customer/user requirements. In these cases, cooling the systems by increasing the air mass flow rates in the traditional fashion is not a practical option.

It will be appreciated that there is a need for a system and an apparatus for effectively cooling the heat dissipating components of an electronic system without increasing the system's enclosure size and cost. A system and an apparatus that address the aforementioned problems, as well as other related problems, are therefore desirable.

SUMMARY OF THE INVENTION

The present invention is directed to addressing the above and other needs in connection with cooling the increasing number of electrical and electronic components that are incorporated in enclosures that remain relatively constant in size. In addition, a single cooling apparatus of the present invention simultaneously provides different levels of cooling in response to the individual cooling needs of the various electronic components.

According to one aspect of the invention, a method for air cooling an electronic system disposed within an enclosure is disclosed. The electronic system to be cooled includes a plurality of electronic components and a blower arrangement coupled to a plenum. The method includes configuring the plenum to have at least one inlet and a plurality of outlets, wherein a first plenum outlet has a smaller outlet size than a second plenum outlet. At least two air ducts are coupled to the plenum outlets such that a first one of the air ducts is coupled to the first plenum outlet and a second one of the air ducts is coupled to the second plenum outlet. The first one of the air ducts produces a greater rate of airflow than the second one of the air ducts. The first one of air ducts is directed to a first set of electronic components and while the second one of the air ducts is directed to a second set of electronic components, wherein the first set of electronic components dissipate more heat than the second set of electronic components.

According to another aspect of the invention, an electronic system within an enclosure includes a cooling arrangement that cools a plurality of electronic components and a plenum. The plenum has an inlet and a plurality of outlets with the inlet receiving air from outside the enclosure. A rate of airflow at the respective plenum outlets varies as a function of a static air pressure behind the plenum outlets and a shape of the respective outlets, the static air pressure being a function of the shape of a cavity within the plenum. The system also includes a plurality of air ducts respectively coupled to the plurality of plenum outlets, with each air duct having a length and an outlet characterized by an outlet size. A first one of the air ducts has an outlet that is disposed proximate a first subset of the electronic components and a second one of the air ducts has an outlet that is disposed proximate a second subset of the electronic components. The electronic system further includes a blower arrangement disposed within the enclosure that draws external air and blows the air into the plenum.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings in which:

FIGS. 4A and 4B are front and perspective views of an electronic system in combination with a cooling apparatus made in accordance with an example embodiment of the invention.

Figure 1:
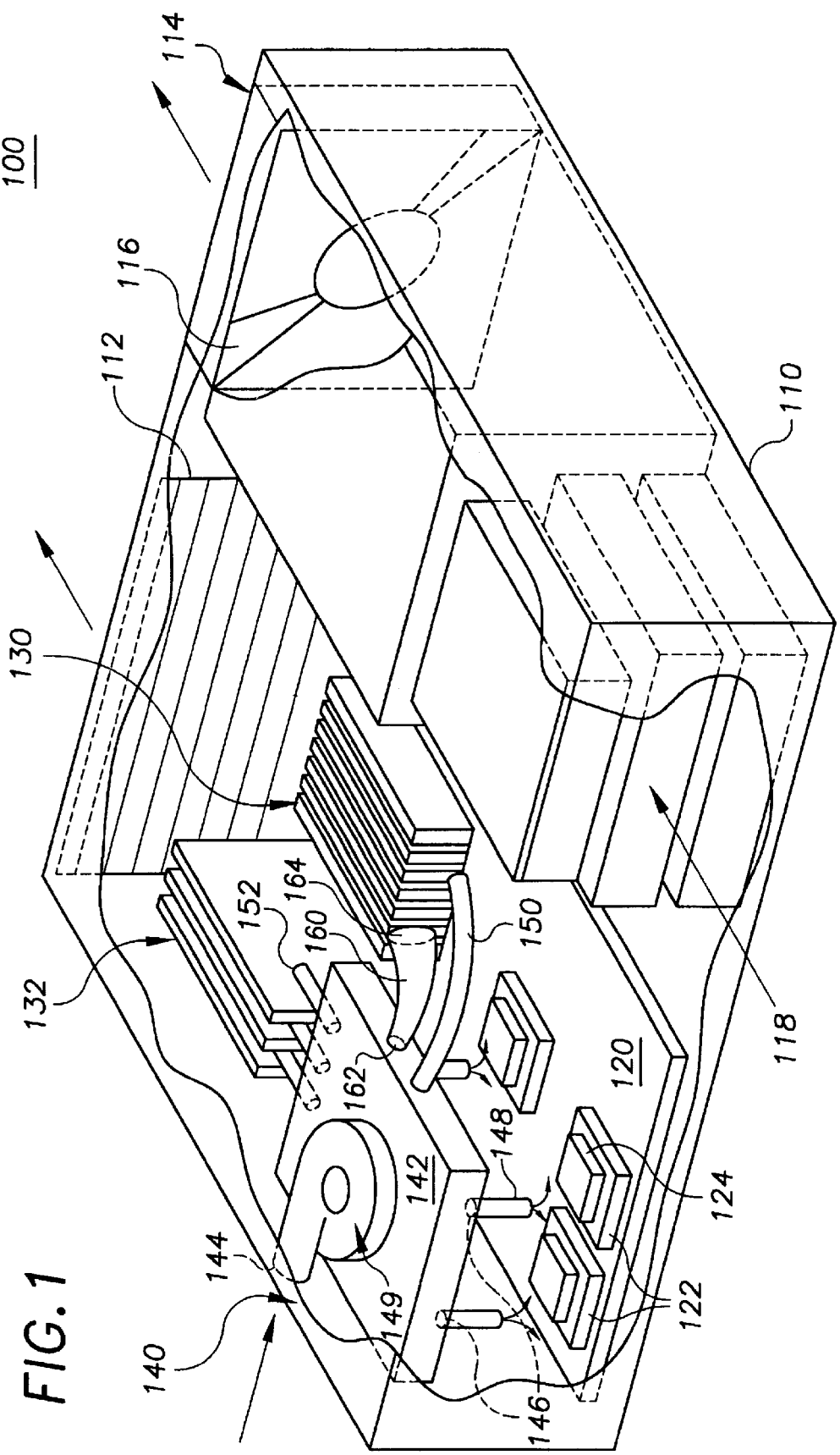
FIG. 1 is an electronic system with a cooling apparatus therein made in accordance with an example embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Various embodiments of the present invention are described in terms of a cooling apparatus that simultaneously provides different levels of cooling in response to the cooling needs of the various electronic components within the enclosure. Those skilled in the art will appreciate that the invention could be implemented in a variety of electronic systems and in various configurations.

In an example embodiment of the present invention, a cooling apparatus for an electronic system is disposed within an enclosure. The cooling apparatus is coupled to a blower that blows air through the cooling apparatus having an inlet and a plurality of outlets. The inlet receives air from outside the enclosure via the blower arrangement. A plenum is one example of a cooling apparatus that can be used in a variety of cooling systems. The plenum can be made of various materials including plastic, ceramic, metal or other materials that are sufficiently rigid to form a structure with a cavity therein. By forming the plenum in a tapered shape, a rate of airflow at the respective plenum outlets will be varied as the static air pressure behind the plenum outlets changes. The shape and size of the respective outlets is increased where certain electronic components need more air volume to remove air that has been heated by the components (preheated).

Referring now to the figures, FIG. 1 is an electronic system 100 with a cooling apparatus 140 therein made in accordance with an example embodiment of the invention. Electronic system 100 includes a plurality of electronic components, such as components 122 and 130, that are disposed within an enclosure 110. Enclosure 110 also includes at least two vents 112 and 114 for venting out air that has been heated by the electronic components (preheated air), some of which is removed by a fan 116 and some of which is removed by cooling apparatus 140. Most of the preheated air removed by fan 116 is generated by a series of disk drives 118 or generated by a power supply for the electronic system located within the enclosure. Preheated air is generated by a first set of electronic components 122 on a system board 120 and is generated by a second set of electronic components on circuit boards 130 and 132. In this example embodiment, components 122 include microprocessors while components 130 and 132 include memory elements and DIMM (Dual In-line Memory Modules) circuit boards that are mounted on card edge connectors in a side by side relationship.

In the past, cooling fans placed near vents 112 have only been effective at removing preheated air from those electronic components located near vents 112. Components 122 benefit from spot cooling or from having a sheet of non-preheated airflow over the components to more efficiently cool the components. In this example embodiment, system 100 include optional heat sinks 124 disposed over components 122 to improve heat dissipation. Cooling apparatus 140 provides an advantage of spot cooling some of the components while diverting preheated air to vents 112 for another set of components. Cooling apparatus 140 includes a plenum 142 that has an inlet 144 and a plurality of outlets 146, with inlet 144 being configured to draw air from outside enclosure 110. Cooling apparatus 140 also includes a plurality of air ducts 148–152 that are respectively coupled to plenum outlets 146, with each air duct having a length and an outlet characterized by an outlet size. A first one of the air ducts 148 has an outlet disposed proximate the electronic components 122 with a second one of the air ducts 150 having an outlet disposed proximate the electronic components 130. A rate of airflow at the outlet of the first duct 148 is produced that is greater than a rate of airflow at the outlet of the second duct 150 due to the difference between the length and outlet size of a first air duct and the length and outlet size of a second air duct. Cooling apparatus 140 further includes a blower arrangement 149 disposed within enclosure 110 that draws air from plenum inlet 144 and pressurizes the plenum by forcing air into plenum 142.

Due to the different levels of heat generated by the various electronic components within enclosure 110, the cooling needs of the various components vary. For spot cooling of certain components, such as microprocessors, a high velocity (about 10 meters per second) and low flow rate of air (about 3 cubic-feet per minute (CFM)) is desired. On the other hand, cooling memory components 130 require higher volume flow rates (about 10 CFM) that can be accomplished with a sheet of airflow over the components. Using the same cooling apparatus, various airflow rates can be generated at the various air duct outlets by varying the static air pressure behind the plenum outlets and varying the outlet size (i. e., area). For example, an outlet 162 from plenum 142 is coupled to air duct 160. Outlet 162 and air duct 160 have a thin elliptical shape so as to generate an airflow sheet over memory components 130 of the electronic system as air from plenum 142 is forced out of a thin elliptical remote opening 164 of air duct 160. In turn, the static air pressure behind plenum outlets 148 is a function of the structure of plenum cavity 142 and the blower speed of blower arrangement 149. The static air pressure and flow rate from each of the air ducts is a function of the shape of the plenum and the shape of the air duct outlets. The static air pressure in the plenum is made more uniform by adding a divider within the cavity of plenum 142 above the outlet and closer to the plenum inlet. The divider serves to dampen the air turbulence within the plenum so that the air flowing through the plenum outlets is steady and uniform. Divider structures include flat panels, screens, filters or honeycombs that separate the inlet from the plenum outlets. The dividers may also serve to vary the static air pressure behind the plenum outlets. In this example embodiment, blower 149 is disposed within plenum 142 and proximate to plenum inlet 144 to provide an advantage of saving space within enclosure 110.

In a related embodiment, the airflow velocity and volume is varied by controlling the blower speed of the blower 149 and by using dampers or baffles (or a valve) to close certain plenum outlets when desired. The variation of blower speed and the outlet dampening actions are controlled, either electronically or thermally (e.g., thermocouple control), as a function of the temperature within the enclosure and/or as a function of energy savings desired. Where the temperature within enclosure 110 rises (primarily caused by the accumulation of preheated air), the blower speed can be increased and/or any of the plenum outlets opened to increase the flow of air over the components. On the other hand, energy is saved by lowering the blower speed or by simply closing certain plenum outlets and directing the airflow to certain components that are running at higher temperatures. Blower arrangement 149 includes two blower members for redundancy and for varying a flow volume of air through the plenum.

Figure 2:
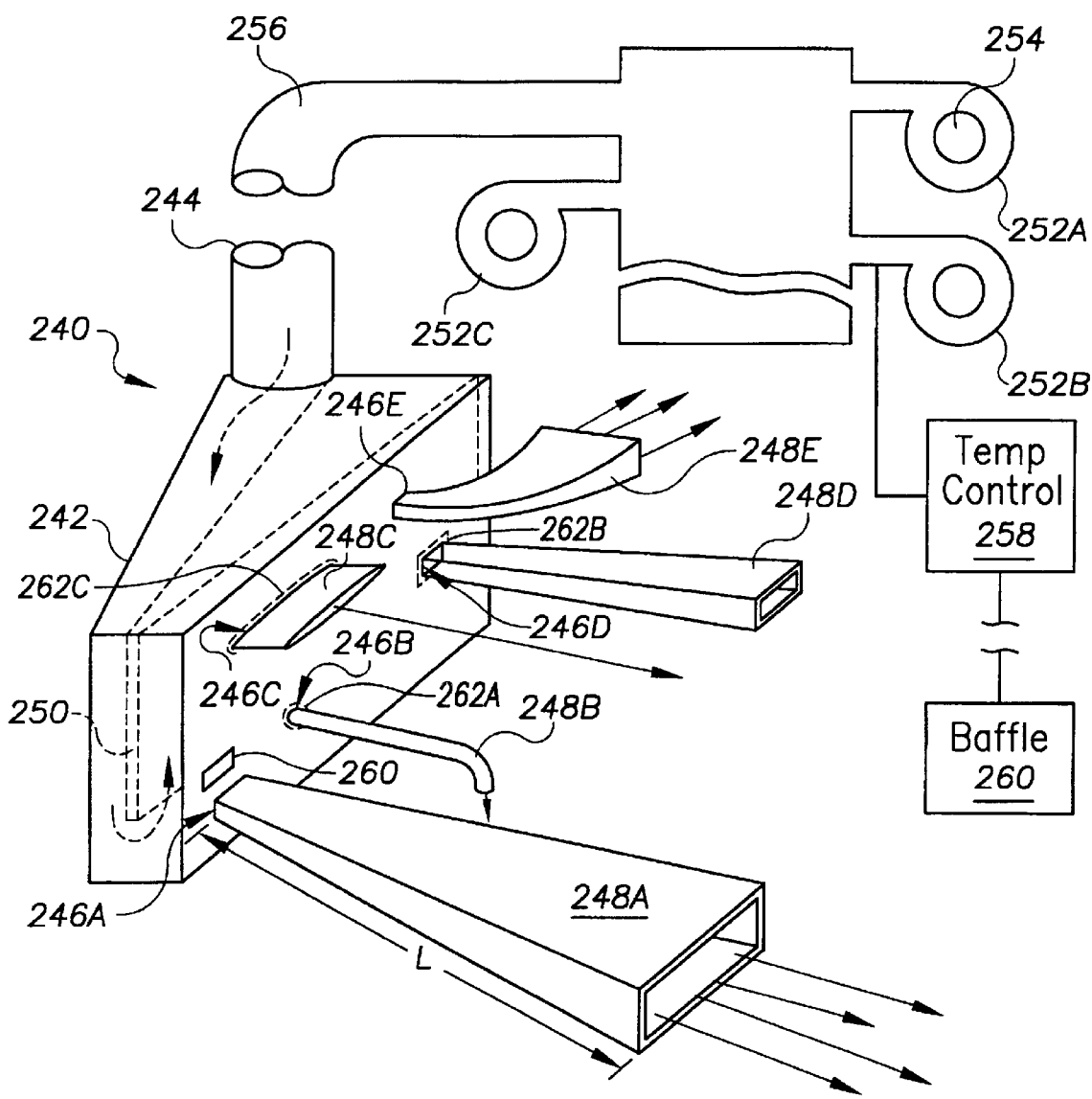
FIG. 2 is a cooling apparatus that provides several levels of cooling made in accordance with another example embodiment of the invention.

Referring now to FIG. 2, a cooling apparatus 240 that simultaneously provides different cooling levels for various electronic components is made in accordance with another example embodiment of the invention. Cooling apparatus 240 is coupled to a blower arrangement 252A–252C that blow air through the cooling apparatus when the apparatus is disposed within an enclosure of an electronic system. Apparatus 240 includes a plenum 242 having an inlet 244 and a plurality of outlets 246A–246E, wherein inlet 244 receives air from outside an enclosure via the blower arrangement. Apparatus 240 also includes a plurality of air ducts 248A–248E that are respectively coupled to the plurality of plenum outlets 246A–246E, with each air duct having a length L and an outlet characterized by an outlet size. A rate of airflow at the outlet of the first air duct 248A (20 CFM; 200LFPM (1 meter/sec.)) is produced that is greater than a rate of airflow at the outlet of the second air duct 248B (4 CFM (2 liters/sec.); 1600 LFPM (8 meters/sec.)) due to the difference between the length and outlet size of a first air duct and the length and outlet size of a second air duct. Plenum outlet 246C and air duct 248C are configured to generate an airflow sheet over an electronic component(s) to help divert preheated air out of an enclosure. In a related embodiment, the rate of airflow varies as a function of the air duct shape and the shape of the air duct exit (e.g., air duct 248A).

Using a single cooling apparatus, various airflow rates are generated at the air duct outlets by varying the static air pressure behind the plenum outlets. The static air pressure behind plenum outlets 246A–246E is a function of the tapered structure of the cavity of plenum 242 and the blower speed of the two blowers 252A and 252B. Adding a divider 250 within cavity structure of plenum 242 stabilizes the static air pressure in plenum 242. Air is received by plenum 242 via a system inlet 254, a channel 256 and plenum inlet 244. In a related embodiment, the airflow velocity and volume is varied by controlling the blower speed of blowers 252A and 252B and by dampening or shutting certain plenum outlets with a baffle or a valve 260 or via dampers, for example, 262A, 262B, and 262C, within plenum 242. The variation of blower speed and control of dampening actions is controlled by a temperature control 258 as a function of the temperature inside an enclosure or the amount of energy savings desired.

Figure 3:
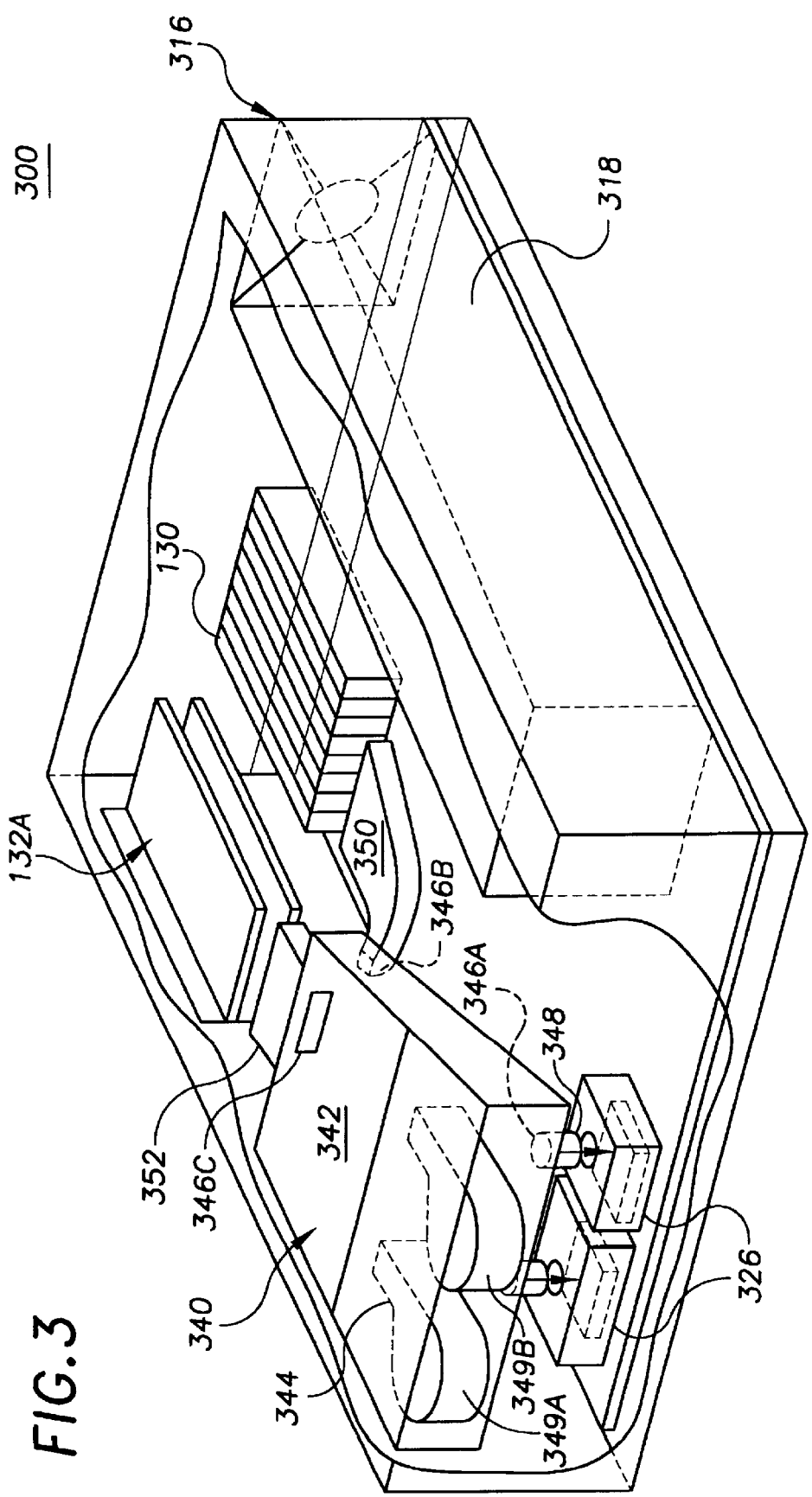
FIG. 3 is an electronic system with a cooling apparatus therein made in accordance with an example embodiment of the invention.

Referring now to FIG. 3 is an electronic system 300 with a cooling apparatus 340 therein made in accordance with an example embodiment of the invention. Like elements between systems 100 and 300 are similarly labeled for ease of description in the specification. Electronic system 300 includes a plurality of electronic components (e.g., 122 and 130) that are disposed within an enclosure 110. Enclosure 110 also includes vents for venting out air (preheated air) that has been heated by the electronic components as well as vents for the intake of cooling air. Most of the preheated air generated by a power supply 318 used by the electronic system is removed by a fan 316. Preheated air is generated by electronic components 122, 130 and 132. An optional cover 326 disposed over components 122 is included as part of system 300 to improve cooling of these components.

Cooling apparatus 340 includes a plenum 342 that has a set of inlets 344 and a plurality of outlets 346, with inlets 344 being configured to draw air from outside enclosure 110. Cooling apparatus 340 also includes a plurality of air ducts 348–352 that are respectively coupled to plenum outlets 346A–346C, with each air duct having a length and an outlet characterized by an outlet size. Air ducts 348 have outlets that are disposed proximate electronic components 122 while air ducts 350–352 have outlets that are disposed proximate electronic components 130. A rate of airflow at the outlet of air duct 348 is produced that is greater than a rate of airflow at the outlet of the air duct 350 due to the difference between the length, shape and outlet size of air duct 348 versus the length, shape and outlet size of air duct 350.

Cooling apparatus 340 further includes a set of blowers 349A and 349B that are disposed outside of plenum 342 and that draw air from a vent on the enclosure and force air into plenum 342 through plenum inlets 344. In this example embodiment, air ducts 348 provide spot cooling for microprocessor devices with an airflow rate of about 4 CFM (2 liters/sec.) with a velocity of about 8 meters/sec. (1600 LFPM). This compares to the cooling provided by air duct 350 with an airflow rate of about 20 CFM (10 liters/sec.) with a velocity of about 1 meters/sec. (200 LFPM). In this example embodiment, the airflow rate and velocity is varied by varying the shape of the cavity structure of the plenum. Plenum 342 has a tapered/conical shape as it terminates at the outlets for air ducts 350 and 352. The tapered shape varies the static air pressure behind the outlets thereby varying the airflow coming out of air ducts 350 and 352.

Figure 4B:
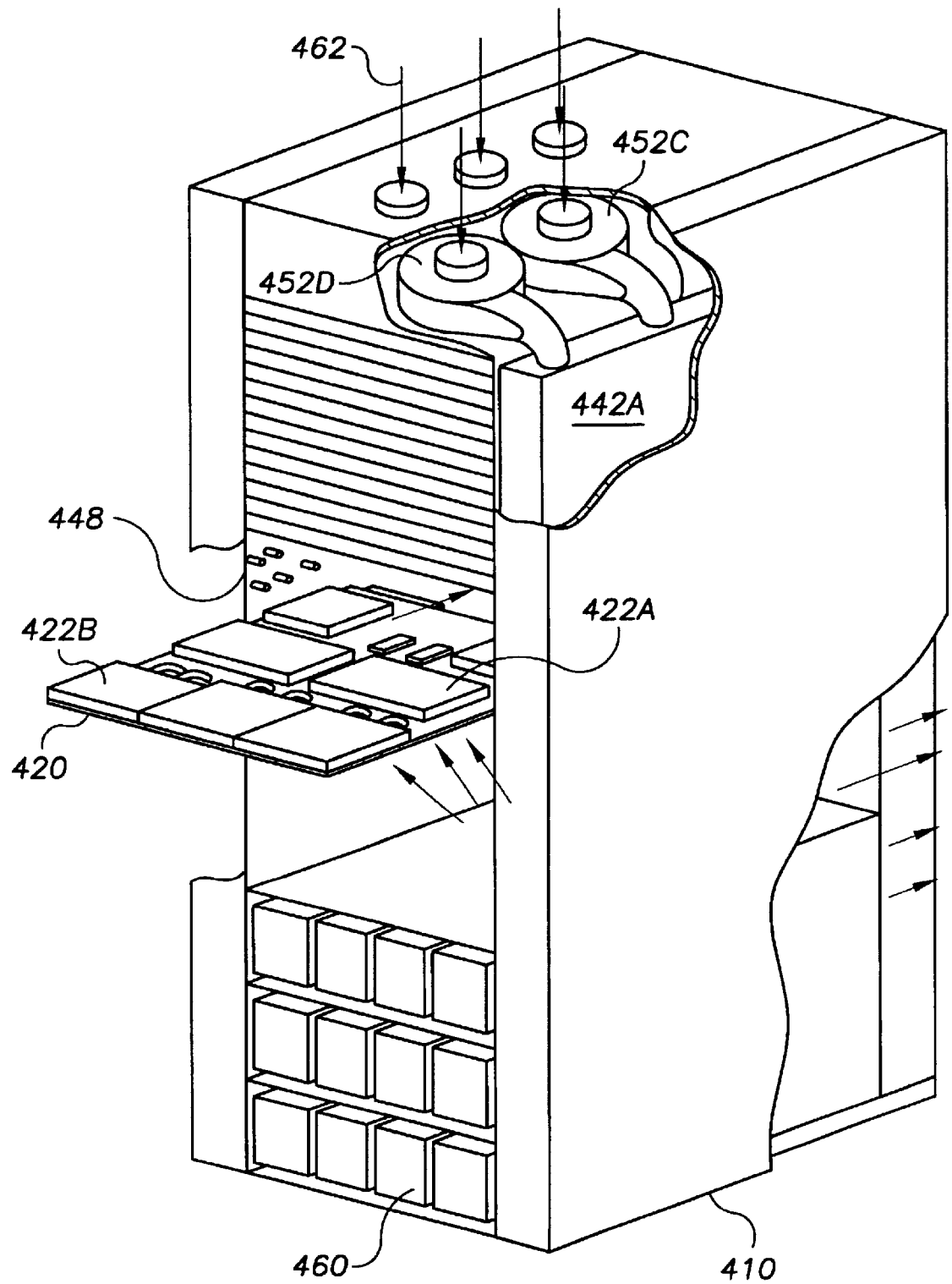

Referring now to FIGS. 4A and 4B are front and perspective views of an electronic system 400 in combination with a cooling apparatus 440 made in accordance with an example embodiment of the invention. Cooling apparatus 440 of electronic system 400 is disposed within an enclosure 410 and cools a plurality of electronic components contained within the enclosure. The electronic system includes a set of plenums 442A–442B that are disposed along the inside walls of enclosure 410. Plenums 442A–442B have inlets 444A–444B for receiving external air and a plurality of outlets 446A–446B. The plenums generate a rate of airflow at plenum outlets 446A and 446B that varies as a function of both an static air pressure behind the plenum outlets and the shape of the plenum outlets. The static air pressure behind the outlets is a function of a cavity structure of the plenum. The turbulence generated by the blowers within the plenums is reduced and the static pressure made uniform by either adding dividers in plenums 442A and 442B or by designing the plenums to have tapered ends 443A and 443B. A power supply 460 for electronic system 400 is disposed within the enclosure and is air-cooled as air flows through enclosure 410 from front to back.

Electronic system 400 also includes a plurality of air ducts 448A and 448B that are respectively coupled to the plenum outlets 446A and 446B, with each air duct having a length and an outlet characterized by an outlet size. Air ducts 448A have outlets that are disposed proximate the electronic components 422A on a system board 420. Air ducts 448B have outlets that are disposed proximate the electronic components 422B on system board 420. The electronic system further includes a set of blowers 452A and 452B disposed within the enclosure that draw air external to the enclosure and force the air into the plenums. Depending on the cooling needs within enclosure 410, the blower speed of the blowers can be varied to vary the static air pressure within the plenum cavity and behind the plenum outlets. Varying the outlet size and the length of the air ducts also vary the airflow rate, thereby varying the cooling rate at each air duct.

In the embodiment illustrated in FIG. 4B, electronic system 400 is implemented with two blowers 452C–452D per plenum with the air ducts 448 being disposed adjacent system board 420 and electronic components 422A–422B to be cooled. In this example embodiment, the airflow rate is 4

CFM and the velocity is 8–10 meters/sec. for a board that generates about 80 watts of heat. The cooling apparatus as described is not limited to using two blowers and two plenums or to using two blowers per plenum. Power (DC or AC) is also supplied via ports 462 disposed at the top portion of enclosure 410. In a related embodiment, electronic system 400 includes a dampening device within the cavity structure of the plenum for closing one or more of the plenum outlets. The opening and closing of the outlets also helps to control the cooling capabilities of cooling apparatus 440. Blowers for any of the applications described may be obtained from Ametek Blowers of Kent, Ohio.

The present invention is believed to be applicable to a variety of electronic systems benefiting from compact and inexpensive cooling systems. The present invention has been found to be particularly applicable and beneficial in computers and servers. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An air cooled electronic system comprising:
    an enclosure;
    a plurality of electronic components;
    a plenum disposed within the enclosure, the plenum having an inlet and a plurality of outlets, the inlet configured and arranged to receive air from outside the enclosure, each outlet being coupled to a first end of a respective air duct, a second end of each respective air duct being disposed proximate a corresponding portion of the electronic components;
    a plurality of dampers disposed within the plenum and proximate to the respective outlets to control airflow at one or more of the plenum outlets; and
    a blower arrangement disposed within the enclosure and arranged to motivate air from external to the enclosure and into the plenum.

2. The system of claim 1, wherein a combination of the length and outlet size of a first air duct is different from a combination of the length and outlet size of a second air duct to produce a rate of airflow at the outlet of the first air duct that is greater than a rate of airflow at the outlet of the second air duct.

3. The system of claim 2, further comprising a divider disposed within the plenum to form a uniform air pressure within the plenum.

4. The system of claim 1, wherein the blower arrangement is disposed within the plenum.

5. An air cooled electronic system, comprising:
    an enclosure;
    a plurality of electronic components;
    a plenum is disposed within the enclosure, the plenum having an inlet and a plurality of outlets, the inlet configured and arranged to receive air from outside the enclosure, wherein a rate of airflow at the respective outlets varies as a function of an air pressure behind the plenum outlets and a shape of the respective outlets, the air pressure being a function of a cavity structure of the plenum;
    a plurality of air ducts respectively coupled to the plurality of plenum outlets, each air duct having a length and an outlet characterized by an outlet size, wherein a first one of the air ducts having an outlet disposed proximate a first subset of the electronic components and a second one of the air ducts having an outlet disposed proximate a second subset of the electronic components;
    a blower arrangement disposed within the enclosure and arranged to draw air from external to the enclosure and into the plenum; and
    a plurality of dampers disposed within the plenum and proximate to the respective outlets to control airflow at one or more of the plenum outlets,
    wherein a combination of the length and outlet size of the first air duct is different from a combination of the length and outlet size of the second air duct to produce a rate of airflow at the outlet of the first air duct that is greater than a rate of airflow at the outlet of the second air duct, and the blower arrangement and the dampers are temperature controlled to change the rate of airflow at the respective plenum outlets in response to a temperature level of preheated air within the enclosure.

6. The system of claim 1, wherein one of the air ducts extends between a set of circuit boards that have the second subset of components disposed thereon.

7. The system of claim 2, wherein the outlet of the second one of the air ducts extends laterally such that a plurality of circuit boards mounted in a side by side relationship are all cooled simultaneously.

8. An air cooled electronic system, comprising:
    an enclosure;
    a plurality of electronic components;
    a plenum is disposed within the enclosure, the plenum having an inlet and a plurality of outlets, the inlet configured and arranged to receive air from outside the enclosure, wherein a rate of airflow at the respective outlets varies as a function of an air pressure behind the plenum outlets and a shape of the respective outlets, the air pressure being a function of a cavity structure of the plenum;
    a plurality of air ducts respectively coupled to the plurality of plenum outlets, each air duct having a length and an outlet characterized by an outlet size, wherein a first one of the air ducts having an outlet disposed proximate a first subset of the electronic components and a second one of the air ducts having an outlet disposed proximate a second subset of the electronic components; and
    a blower arrangement disposed within the enclosure and arranged to draw air from external to the enclosure and into the plenum,
    wherein a combination of the length and outlet size of the first air duct is different from a combination of the length and outlet size of the second air duct to produce a rate of airflow at the outlet of the first air duct that is greater than a rate of airflow at the outlet of the second air duct, and one of the plenum outlets and one of the second air ducts have a thin elliptical shape so as to generate an airflow sheet over the electronic components of the electronic system.

9. A method for air cooling an electronic system disposed within an enclosure, the electronic system including a plurality of electronic components and a blower arrangement coupled to a plenum, the method comprising:
    configuring the plenum to have at least one inlet and a plurality of outlets, wherein a first plenum outlet has a smaller outlet size than a second plenum outlet;
    controlling the airflow from the plenum outlets by disposing a plurality of dampers within the plenum proximate to the plenum outlets before the step of coupling the air ducts to the plenum outlets;

coupling at least two air ducts to the plenum outlets, a first one of the air ducts being coupled to the first plenum outlet and a second one of the air ducts being coupled to the second plenum outlet, wherein the first one of the air ducts produces a greater rate of airflow than the second one of the air ducts;

directing the first one of air ducts to a first set of electronic components and directing the second one of the air ducts to a second set of electronic components; and adjusting an outlet size of the second one of the air ducts to generate an airflow sheet over the second set of components before the step of directing the air ducts, wherein the first set of electronic components dissipate more heat than the second set of electronic components.

10. The method of claim 9, wherein the step of configuring the plenum includes stabilizing a static air pressure within the plenum by configuring the plenum to include therein a divider.

11. The method of claim 9, wherein the step of configuring the plenum includes locating the blower arrangement within the plenum thereby reducing the space utilized within the enclosure.

12. A method for air cooling an electronic system disposed within an enclosure, the electronic system including a plurality of electronic components and a blower arrangement coupled to a plenum, the method comprising:

configuring the plenum to have at least one inlet and a plurality of outlets, wherein a first plenum outlet has a smaller outlet size than a second plenum outlet;

coupling at least two air ducts to the plenum outlets, a first one of the air ducts being coupled to the first plenum outlet and a second one of the air ducts being coupled to the second plenum outlet, wherein the first one of the air ducts produces a greater rate of airflow than the second one of the air ducts; and directing the first one of air ducts to a first set of electronic components and directing the second one of the air ducts to a second set of electronic components, wherein the first set of electronic components dissipate more heat than the second set of electronic components and the step of configuring the plenum includes forming the plenum with a tapered section proximate the plenum outlets, the tapered section disposed laterally from the blower arrangement.

13. The system of claim 1, wherein the blower arrangement is disposed outside the plenum.

14. The system of claim 1, wherein the blower arrangement includes variable speed control.

15. The system of claim 1, wherein the blower arrangement includes a plurality of blowers.

16. The system of claim 1, wherein the plenum has an outlet on more than one plenum surface.

17. The system of claim 1, wherein a first air duct has a different cross-sectional geometry than a second air duct.

18. The system of claim 1, wherein an air duct has more than one end disposed proximate a portion of the electronic components.

19. The system of claim 1, wherein a portion of the electronic components has a cover thereover and a second end of an air duct is coupled to exhaust into the cover.

20. The system of claim 1, further comprising a damper disposed within the plenum and proximate to an outlet to control airflow through the outlet.

21. The system of claim 1, further comprising a channel disposed between the inlet and the blower arrangement.

22. The system of claim 2, wherein one of the air ducts have an elliptical shape so as to generate an airflow sheet over a portion of the electronic components.

23. The system of claim 1, further comprising a plurality of dampers disposed within the plenum and proximate to the respective outlets to control airflow at one or more, wherein the blower arrangement and the dampers are temperature controlled to change the rate of airflow at the respective plenum outlets in response to an air temperature within the enclosure.

* * * * *